United States Patent
Pan et al.

(10) Patent No.: US 9,490,453 B2
(45) Date of Patent: Nov. 8, 2016

(54) QUASI-CRYSTAL ORGANIC LIGHT-EMITTING DISPLAY PANEL AND METHOD FOR SIMULATING OPTICAL EFFICIENCY OF THE SAME

(71) Applicant: Winbond Electronics Corp., Taichung (TW)

(72) Inventors: Jui-Wen Pan, Hsinchu (TW); Che-Wen Chiang, New Taipei (TW); Chang-Yi Li, Yunlin County (TW); Yung-Chih Huang, Chiayi County (TW)

(73) Assignee: Winbond Electronics Corp., Taichung (TW)

( * ) Notice: Subject to any disclaimer, the term of this patent is extended or adjusted under 35 U.S.C. 154(b) by 8 days.

(21) Appl. No.: 14/506,708

(22) Filed: Oct. 6, 2014

(65) Prior Publication Data

US 2016/0099436 A1 Apr. 7, 2016

(51) Int. Cl.
*H01L 51/52* (2006.01)
*G09G 3/20* (2006.01)
*H01L 27/32* (2006.01)

(52) U.S. Cl.
CPC ............. *H01L 51/5268* (2013.01); *G09G 3/20* (2013.01); *H01L 51/5203* (2013.01); *H01L 27/3246* (2013.01); *H01L 2251/558* (2013.01); *H01L 2933/0091* (2013.01)

(58) Field of Classification Search
CPC ........... H01L 51/5268; H01L 51/5203; H01L 51/5246; H01L 51/5293; H01L 27/3246
USPC .......................................................... 257/40
See application file for complete search history.

(56) References Cited

U.S. PATENT DOCUMENTS

| | | | | |
|---|---|---|---|---|
| 2004/0031966 A1* | 2/2004 | Forrest | H01L 27/30 | 257/79 |
| 2006/0066228 A1* | 3/2006 | Antoniadis | H01L 51/5262 | 313/506 |
| 2006/0220509 A1* | 10/2006 | Ghosh | B82Y 20/00 | 313/110 |
| 2009/0015142 A1* | 1/2009 | Potts | B82Y 20/00 | 313/504 |
| 2009/0015757 A1* | 1/2009 | Potts | B82Y 20/00 | 349/69 |
| 2011/0108811 A1* | 5/2011 | Seo | H01L 51/5246 | 257/40 |
| 2011/0121351 A1* | 5/2011 | Lee | H01L 51/5088 | 257/99 |
| 2012/0091436 A1* | 4/2012 | Forrest | C30B 23/02 | 257/40 |
| 2012/0119253 A1* | 5/2012 | Schlenker | H01L 51/0525 | 257/99 |
| 2013/0207093 A1* | 8/2013 | Jeong | H01L 51/5243 | 257/40 |
| 2014/0166998 A1* | 6/2014 | Lee | H01L 27/3276 | 257/40 |

OTHER PUBLICATIONS

Kao-Der Chang, et al., "A hybrid simulated method for analyzing the optical efficiency of a head-mounted display with a quasi-crystal OLED panel," Optics Express, vol. 22, No. S2, Mar. 10, 2014, pp. A567-pp. A576.

* cited by examiner

*Primary Examiner* — Nathan Ha
(74) *Attorney, Agent, or Firm* — Jianq Chyun IP Office

(57) ABSTRACT

A quasi-crystal organic light-emitting display panel including a first electrode layer, an organic light-emitting layer, a second electrode layer, a buffer layer, a 10-fold quasi-crystal layer and a package cover is provided. The organic light-emitting layer is located on the first electrode layer. The second electrode layer is located on the organic light-emitting layer. The buffer layer is located on the second electrode layer. The 10-fold quasi-crystal layer is located on the buffer layer. The package cover is located on the 10-fold quasi-crystal layer. A method for simulating optical efficiency of the quasi-crystal organic light-emitting display panel is also provided.

9 Claims, 3 Drawing Sheets

QUASI-CRYSTAL ORGANIC LIGHT-EMITTING DISPLAY PANEL AND METHOD FOR SIMULATING OPTICAL EFFICIENCY OF THE SAME

BACKGROUND

Technical Field

The invention relates to a display panel and a simulation method, and particularly relates to a quasi-crystal organic light-emitting display panel and a method for simulating optical efficiency of the same.

Related Art

Since organic light-emitting display panel has advantages of self-luminous, wide viewing angle, low power consumption, easy procedure, low cost, wide operation temperature, high response speed, full color, etc., it is expected to become a mainstream of flat panel display of the next generation, and is widely applied in flat panel display devices, head-mounted display devices or touch display devices, etc.

Generally, the organic light-emitting display panel is composed of a first electrode layer, a second electrode layer disposed on a substrate and an organic light-emitting layer disposed between the two electrode layers. The substrate and the second electrode layer contacting the substrate generally adopt a transparent material to facilitate the light generated by the organic light-emitting layer emitting out from the substrate. A refractive index of the second electrode layer is generally greater than a refractive index of the substrate, and the refractive index of the substrate is greater than a refractive index of air. Since when the light enters a low refractive index material from a high refractive index material, the light is liable to have a total reflection at an interface between the high and low refractive index materials, the light emitted by the organic light-emitting layer probably has the total reflection at the interface between the second electrode layer and the substrate and at the interface between the substrate and the air, such that optical efficiency of the organic light-emitting display panel is poor.

SUMMARY

The invention is directed to a quasi-crystal organic light-emitting display panel, which has a good optical efficiency.

The invention is directed to a method for simulating optical efficiency of quasi-crystal organic light-emitting display panel, by which optical efficiencies of the quasi-crystal organic light-emitting display panel with different quasi-crystal layers are simulated.

The invention provides a quasi-crystal organic light-emitting display panel including a first electrode layer, an organic light-emitting layer, a second electrode layer, a buffer layer, a 10-fold quasi-crystal layer and a package cover. The organic light-emitting layer is located on the first electrode layer. The second electrode layer is located on the organic light-emitting layer. The buffer layer is located on the second electrode layer. The 10-fold quasi-crystal layer is located on the buffer layer. The package cover is located on the 10-fold quasi-crystal layer.

The invention provides a method for simulating optical efficiency of quasi-crystal organic light-emitting display panel, which includes following steps. A quasi-crystal organic light-emitting display panel is provided, where the quasi-crystal organic light-emitting display panel includes a first electrode layer, an organic light-emitting layer, a second electrode layer, a buffer layer, a 10-fold quasi-crystal layer and a package cover, the organic light-emitting layer is located on the first electrode layer, the second electrode layer is located on the organic light-emitting layer, the buffer layer is located on the second electrode layer, the 10-fold quasi-crystal layer is located on the buffer layer, and the package cover is located on the 10-fold quasi-crystal layer. A finite-difference time-domain (FDTD) method is used to simulate a radiation pattern formed by a radiation emitted by the organic light-emitting layer that reaches an interface between the package cover and the 10-fold quasi-crystal layer. The radiation pattern of the radiation at the interface between the package cover and the 10-fold quasi-crystal layer is transformed through a near-to-far-field (NTFF) transformation to obtain a radiation pattern of the radiation at a surface of the package cover away from the 10-fold quasi-crystal layer. The radiation pattern of the radiation leaving the quasi-crystal organic light-emitting display panel is simulated through geometric optics, and energies of the radiation in the air medium on different angle directions are summed to obtain the optical efficiency.

According to the above descriptions, based on configuration of the quasi-crystal layer, a light extraction efficiency of the quasi-crystal organic light-emitting display panel is improved. Particularly, proved through simulation, the 10-fold quasi-crystal layer adopted by the quasi-crystal organic light-emitting display panel is a quasi-crystal layer capable of providing a relatively ideal scattering effect. Therefore, the quasi-crystal organic light-emitting display panel of the invention has good optical efficiency.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
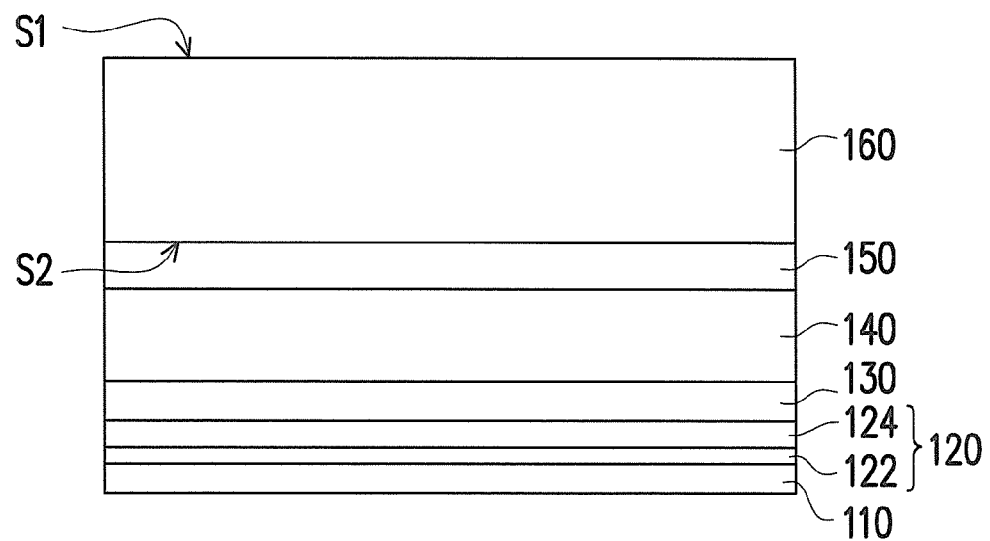
FIG. 1 is a cross-sectional view of an organic light-emitting display panel according to an embodiment of the invention.
Figure 2:
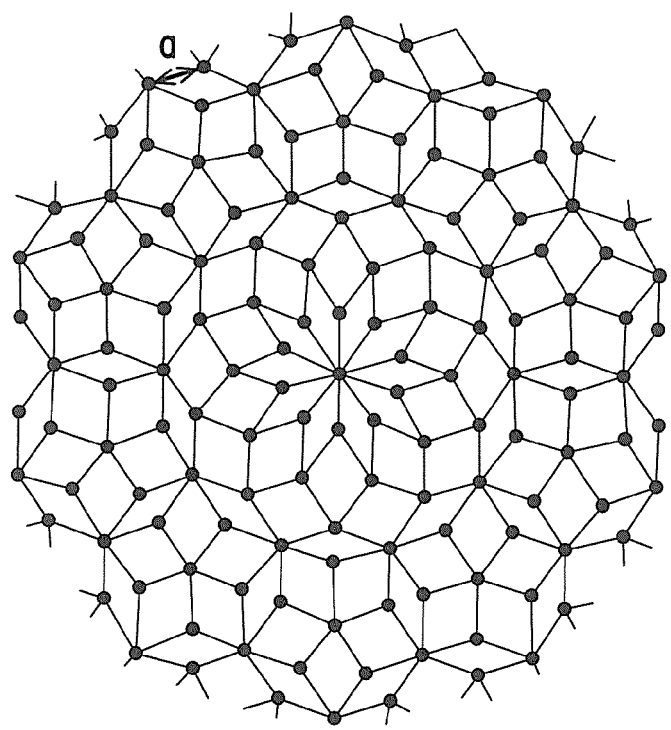
FIG. 2 is a top view of a 10-fold quasi-crystal layer in FIG. 1.

FIG. 1 is a cross-sectional view of an organic light-emitting display panel according to an embodiment of the invention. FIG. 2 is a top view of a 10-fold quasi-crystal layer in FIG. 1. Referring to FIG. 1, the quasi-crystal organic light-emitting display panel 100 includes a first electrode layer 110, an organic light-emitting layer 120, a second electrode layer 130, a buffer layer 140, a 10-fold quasi-crystal layer 150 and a package cover 160. The organic light-emitting layer 120 is located on the first electrode layer 110. The second electrode layer 130 is located on the organic light-emitting layer 120. The buffer layer 140 is located on the second electrode layer 130. The 10-fold quasi-crystal layer 150 is located on the buffer layer 140. The package cover 160 is located on the 10-fold quasi-crystal layer 150.

As shown in FIG. 1, the package cover 160 has an outer surface S1 and an inner surface S2 opposite to the outer surface S1. The 10-fold quasi-crystal layer 150, the buffer layer 140, the second electrode layer 130, the organic light-emitting layer 120 and the first electrode layer 110 are, for example, sequentially stacked on the inner surface S2. In detail, the 10-fold quasi-crystal layer 150 is disposed between the package cover 160 and the buffer layer 140, which is adapted to decrease an interface total reflection to improve a light extraction efficiency. As shown in FIG. 2, the 10-fold quasi-crystal layer 150 has a two-dimensional (2D) periodic structure of 10-fold rotational symmetry, and an atomic arrangement thereof is shown in a following equation (1):

$$f(x, y) = \sum_{n=0}^{n_{fold}/2-1} \cos[2\pi x \cos(2\pi n/n_{fold})/a + 2\pi y \sin(2\pi n/n_{fold})/a] \quad \text{Equation (1)}$$

Where, a is a lattice constant of the 10-fold quasi-crystal layer 150, and $n_{fold}$ is a fold number of the rotational symmetry, for example, $n_{fold}$ of 8-fold quasi-crystal layer is 8, and $n_{fold}$ of 10-fold quasi-crystal layer is 10.

The buffer layer 140 is disposed between the 10-fold quasi-crystal layer 150 and the second electrode layer 130, which is adapted to provide a flat carrying surface to the second electrode layer 130. In the present embodiment, a material of the buffer layer 140 includes silicon nitride. The organic light-emitting layer 120 is disposed between the second electrode layer 130 and the first electrode layer 110. The organic light-emitting layer 120, for example, includes an electron transport layer 122 and a hole transport layer 124, where the electron transport layer 122 is disposed between the hole transport layer 124 and the first electrode layer 110.

The light of the quasi-crystal organic light-emitting display panel 100 is, for example, emitted from the outer surface S1 of the package cover 160. Therefore, the first electrode layer 110 is preferably a reflective electrode layer to reflect the light come from the organic light-emitting layer 120, such that the light transmitted to the first electrode layer 110 is transmitted back and emits from the outer surface S1 of the package cover 160. For example, a material of the first electrode layer 110 is metal or metal alloy. On the other hand, in order to avoid a situation that the second electrode layer 130 shields the light transmitted to the outer surface S1, the second electrode layer 130 is preferably a transparent electrode layer. For example, a material of the second electrode layer 130 is a transparent conductive material, such as metal oxide. The metal oxide includes indium tin oxide, indium zinc oxide, aluminium tin oxide, aluminium zinc oxide, indium germanium zinc oxide, or other suitable metal oxides. Alternatively, the second electrode layer 130 can also be a stacked layer of at least two of the above materials.

Figure 3:
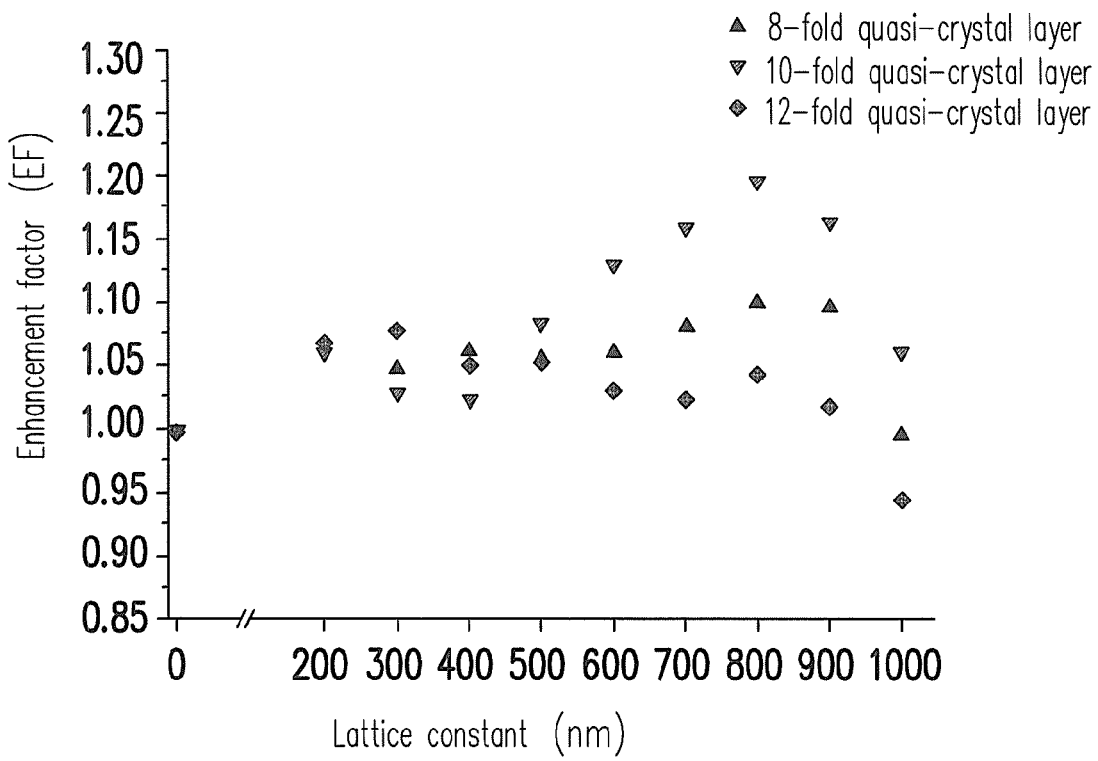
FIG. 3 is a relationship diagram of lattice constant of a quasi-crystal layer and enhancement factor.
Figure 4:
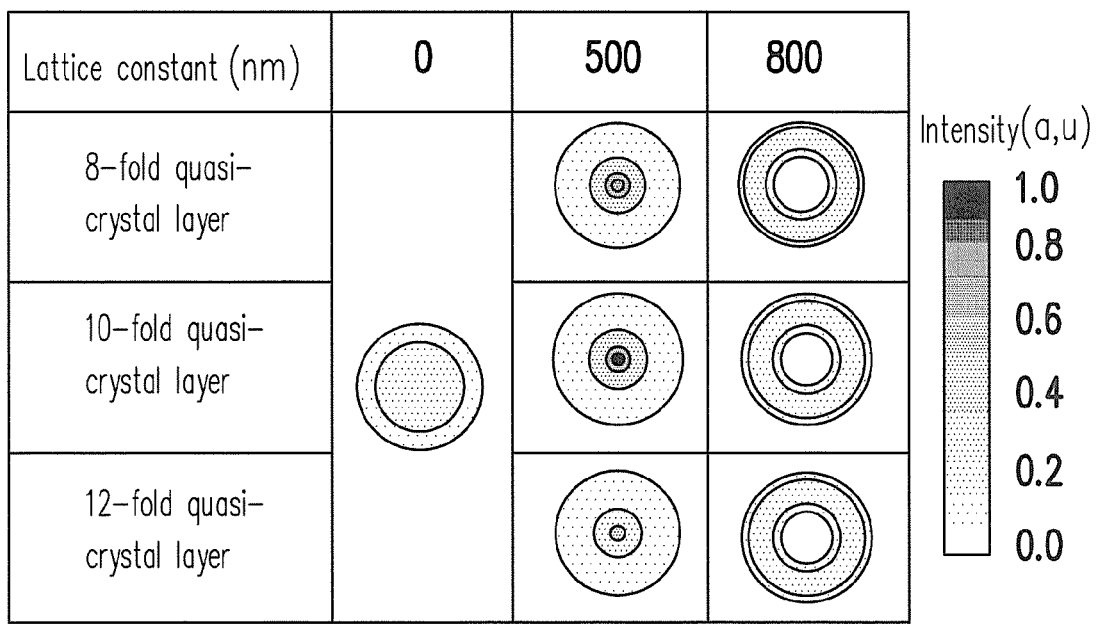
FIG. 4 illustrates radiation patterns used for evaluating optical efficiency.
Figure 5:
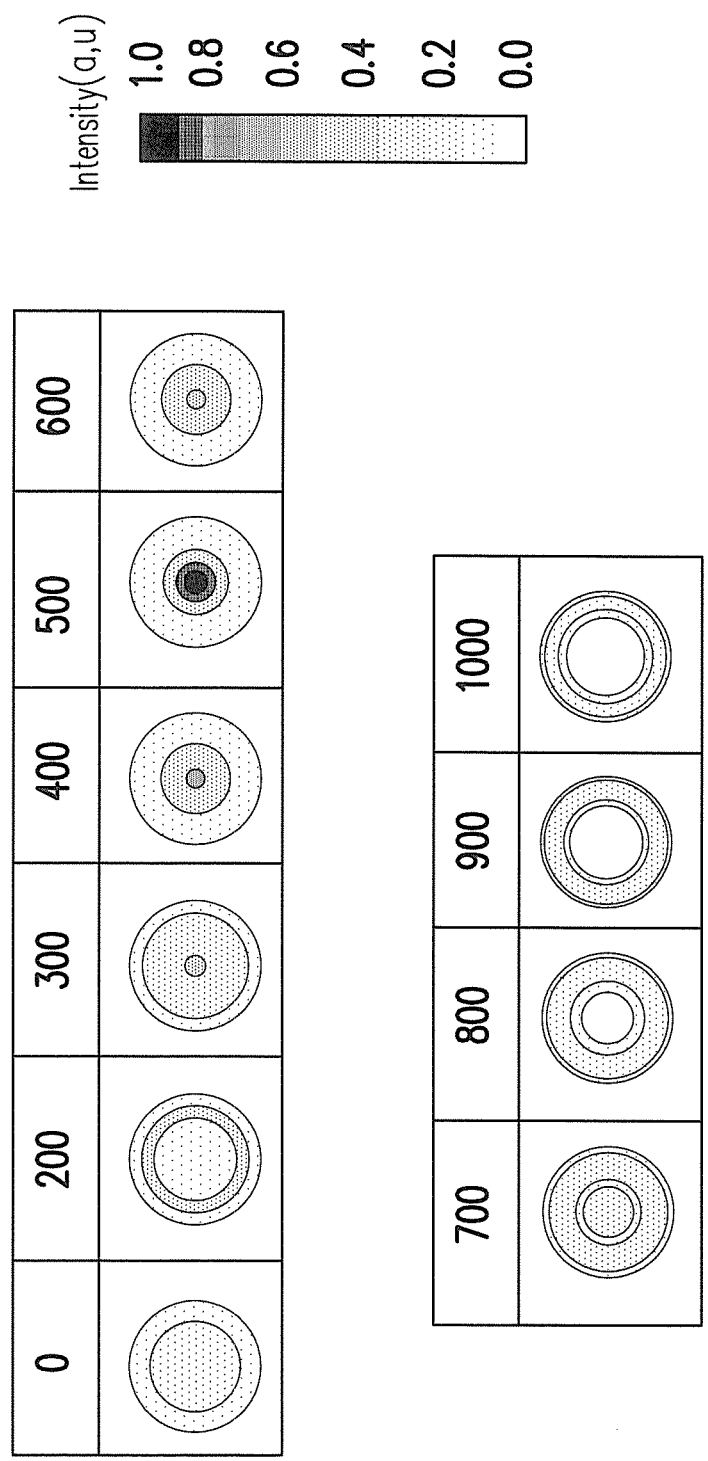
FIG. 5 illustrates radiation patterns of the organic light-emitting display panel applying the 10-fold quasi-crystal layers with different lattice constants.

FIG. 3 to FIG. 5 are provided below to describe the reason why the 10-fold quasi-crystal layer 150 is adopted to decrease the interface total reflection. FIG. 3 is a relationship diagram of lattice constant of the quasi-crystal layer and enhancement factor. FIG. 4 illustrates radiation patterns used for evaluating the optical efficiency. FIG. 5 illustrates radiation patterns of the organic light-emitting display panel applying the 10-fold quasi-crystal layers with different lattice constants. FIG. 3 to FIG. 5 are simulation results of a method for simulating optical efficiency of the quasi-crystal organic light-emitting display panel. The method for simulating optical efficiency of the quasi-crystal organic light-emitting display panel includes following steps. First, the quasi-crystal organic light-emitting display panel is provided, for example, the quasi-crystal organic light-emitting display panel 100 is provided. Then, a finite-difference time-domain (FDTD) method is used to simulate a radiation pattern formed by a radiation emitted by the organic light-emitting layer 120 that reaches an interface (i.e. the inner surface S2) between the package cover 160 and the 10-fold quasi-crystal layer 150. Then, the radiation pattern of the radiation at the interface between the package cover 160 and the 10-fold quasi-crystal layer 150 is transformed through a near-to-far-field (NTFF) transformation to obtain a radiation pattern of the radiation at a surface (i.e. the outer surface S2) of the package cover 160 away from the 10-fold quasi-crystal layer 150. Thereafter, the radiation pattern of the radiation leaving the quasi-crystal organic light-emitting display panel 100 is simulated through geometric optics. Finally, energies of the radiation in the air medium on different angle directions are summed to obtain the optical efficiency.

In the aforementioned simulation process, the quasi-crystal organic light-emitting display panel 100 is divided into three parts. The first part is a near-field structure within the package cover 160, which includes the first electrode layer 110, the organic light-emitting layer 120, the second electrode layer 130, the buffer layer 140 and the 10-fold quasi-crystal layer 150. Since thickness of the film layers in the first part is respectively smaller than a wavelength size, for example, smaller than 1 μm, by using the FDTD method to simulate interference and diffraction situations of the radiation in the film layers, a relatively accurate radiation pattern is obtained.

The second part is electromagnetic field NTFF processing in the package cover 160. Since a thickness of the package cover 160 is far greater than the wavelength, by using the NTFF transformation, the radiation pattern irradiate to the interface between the package cover 160 and the 10-fold quasi-crystal layer 150 can be transformed to obtain the radiation pattern of the radiation at the surface of the package cover 160 away from the 10-fold quasi-crystal layer 150. Further, according to a surface equivalence theorem, a virtual surface S is used to completely encircle a scattering body, and the FDTD method is used to calculate an equivalent current $\vec{J}_1$ and an equivalent magnetic current $\vec{M}_1$ along a tangent direction of the scattering body, and the equivalent current $\vec{J}_S$ and the equivalent magnetic current $\vec{M}_S$ on the virtual surface S can be obtained as shown in following equations (2) and (3):

$$\vec{M}_s = -\hat{n} \times \vec{E}_1 \quad \text{Equation (2)}$$

$$\vec{J}_s = \hat{n} \times \vec{H}_1 \quad \text{Equation (3)}$$

Where, n̂ is a normal vector of the virtual surface S. Then, a NTFF transformation equation may refer to following equations (4)-(13):

$$E_r = 0 \quad \text{Equation (4)}$$

$$E_\theta = -\frac{j\beta e^{-j\beta r}}{4\pi r}[L_\phi - \eta N_\theta] \quad \text{Equation (5)}$$

$$E_\varphi = \frac{j\beta e^{-j\beta r}}{4\pi r}[L_\theta - \eta N_\phi] \quad \text{Equation (6)}$$

$$H_r = 0 \quad \text{Equation (7)}$$

$$H_\theta = \frac{j\beta e^{-j\beta r}}{4\pi r}[N_\phi - L_\theta/\eta] \quad \text{Equation (8)}$$

$$H_\varphi = -\frac{j\beta^{-j\beta r}}{4\pi r}[N_\theta + L_\phi/\eta] \quad \text{Equation (9)}$$

$$N_\theta = \iint_S (\vec{J}_x\cos\theta\cos\phi + \vec{J}_y\cos\theta\sin\phi - \vec{J}_z\sin\theta)e^{jkr'\cos\psi}ds \quad \text{Equation (10)}$$

$$N_\phi = \iint_S (-\vec{J}_x\sin\phi + \vec{J}_y\cos\phi)e^{jkr'\cos\psi}ds \quad \text{Equation (11)}$$

$$L_\theta = \iint_S (\vec{M}_x\cos\theta\cos\phi + \vec{M}_y\cos\theta\sin\phi - \vec{M}_z\sin\theta)e^{jkr'\cos\psi}ds \quad \text{Equation (12)}$$

$$L_\phi = \iint_S (-\vec{M}_x\sin\phi + \vec{M}_y\cos\phi)e^{jkr'\cos\psi}ds \quad \text{Equation (13)}$$

Where, E is an electric field, H is a magnetic field, r is any point outside a near-field space, r' is any point on a calculation surface of the near-field space, β is a wave number of the radiation in a medium, η is an intrinsic impedance, ψ is an included angle of r and r'.

The third part is to use geometric optics to simulate the radiation pattern of the radiation leaving the quasi-crystal organic light-emitting display panel 100 to enter the air medium. For example, when the quasi-crystal organic light-emitting display panel 100 is applied to a head-mounted display device, software (for example, LightTools) used for processing the geometric optics is used to obtain parameters such as radiation pattern, light flux, etc. of the radiation passing through a lens set of the head-mounted display device. Moreover, the enhancement factor EF is defined by a following equation:

$$EF = \frac{\int_{400}^{700}\iint \vec{P}_{Des}(\theta, \varphi, \lambda)R^2\sin(\theta)d\theta d\varphi d\lambda}{\int_{400}^{700}\iint \vec{P}_{Con}(\theta, \varphi, \lambda)R^2\sin(\theta)d\theta d\varphi d\lambda} \quad \text{Equation (14)}$$

Where, R is greater than or equal to 1 mm, $\vec{P}$ is a poynting vector of a far-field pattern when a near-field projection distance is R, Con represents a conventional organic light-emitting display panel without configuring the quasi-crystal layer, and Des represents the quasi-crystal organic light-emitting display panel configured with the quasi-crystal layer.

FIG. 3 to FIG. 5 are far-field patterns simulated when the thickness of the first electrode layer, the organic light-emitting layer, the second electrode layer, the buffer layer and the quasi-crystal layer are respectively 100 nm, 60 nm, 80 nm, 150 nm, 600 nm and 200 nm, where the lattice constant of 0 represents that the quasi-crystal layer is not configured. According to FIG. 3, it is obvious that configuration of the quasi-crystal layer avails improving the enhancement factor, particularly within a section where the lattice constant is smaller than 900 nm. Moreover, when the quasi-crystal layer is the 10-fold quasi-crystal layer, relatively superior enhancement factors are obtained. Moreover, according to FIG. 4 and FIG. 5, it is known that when the lattice constant of the 10-fold quasi-crystal layer is 500 nm, a superior light converging effect and light intensity are achieved. Therefore, by configuring the 10-fold quasi-crystal layer, the quasi-crystal organic light-emitting display panel may have good optical efficiency.

In summary, based on configuration of the quasi-crystal layer, a light extraction efficiency of the quasi-crystal organic light-emitting display panel is improved. Particularly, proved through simulation, the 10-fold quasi-crystal layer adopted by the quasi-crystal organic light-emitting display panel is a quasi-crystal layer capable of providing a relatively ideal scattering effect. Therefore, the quasi-crystal organic light-emitting display panel of the invention has good optical efficiency.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A quasi-crystal organic light-emitting display panel, comprising:
   a first electrode layer;
   an organic light-emitting layer, located on the first electrode layer;
   a second electrode layer, located on the organic light-emitting layer;
   a buffer layer, located on the second electrode layer;
   a 10-fold quasi-crystal layer, located on the buffer layer; and
   a package cover, located on the 10-fold quasi-crystal layer.

2. The quasi-crystal organic light-emitting display panel as claimed in claim 1, wherein the first electrode layer is a reflective electrode layer, and the second electrode layer is a transparent electrode layer.

3. The quasi-crystal organic light-emitting display panel as claimed in claim 1, wherein the organic light-emitting layer comprises an electron transport layer and a hole transport layer, and the electron transport layer is disposed between the hole transport layer and the first electrode layer.

4. The quasi-crystal organic light-emitting display panel as claimed in claim 1, wherein a material of the buffer layer comprises silicon nitride.

5. The quasi-crystal organic light-emitting display panel as claimed in claim 1, wherein a thickness of each of the first electrode layer, the organic light-emitting layer, the second electrode layer, the buffer layer and the 10-fold quasi-crystal layer is smaller than 1 μm, and a thickness of the package cover is greater than 1 μm.

6. The quasi-crystal organic light-emitting display panel as claimed in claim 1, wherein a lattice constant of the 10-fold quasi-crystal layer is 500 nm.

7. A method for simulating optical efficiency of quasi-crystal organic light-emitting display panel, comprising:

providing a quasi-crystal organic light-emitting display panel, wherein the quasi-crystal organic light-emitting display panel comprises a first electrode layer, an organic light-emitting layer, a second electrode layer, a buffer layer, a 10-fold quasi-crystal layer and a package cover, the organic light-emitting layer is located on the first electrode layer, the second electrode layer is located on the organic light-emitting layer, the buffer layer is located on the second electrode layer, the 10-fold quasi-crystal layer is located on the buffer layer, and the package cover is located on the 10-fold quasi-crystal layer;

using a finite-difference time-domain (FDTD) method to simulate a radiation pattern formed by a radiation emitted by the organic light-emitting layer that reaches an interface between the package cover and the 10-fold quasi-crystal layer;

transforming the radiation pattern of the radiation at the interface between the package cover and the 10-fold quasi-crystal layer through a near-to-far-field (NTFF) transformation to obtain a radiation pattern of the radiation at a surface of the package cover away from the 10-fold quasi-crystal layer;

simulating a radiation pattern of the radiation leaving the quasi-crystal organic light-emitting display panel through geometric optics; and summing energies of the radiation in the air medium on different angle directions to obtain the optical efficiency.

8. The method for simulating optical efficiency of quasi-crystal organic light-emitting display panel as claimed in claim 7, wherein a thickness of each of the first electrode layer, the organic light-emitting layer, the second electrode layer, the buffer layer and the 10-fold quasi-crystal layer is smaller than 1 μm, and a thickness of the package cover is greater than 1 μm.

9. The method for simulating optical efficiency of quasi-crystal organic light-emitting display panel as claimed in claim 7, wherein a lattice constant of the 10-fold quasi-crystal layer is 500 nm.

* * * * *